(12) United States Patent
Cargol (10) Patent No.: US 7,960,868 B1
(45) Date of Patent: Jun. 14, 2011

(54) METHODS FOR GENERATING HIGH VOLTAGE PULSES WITH A TRANSMISSION LINE

(76) Inventor: Timothy L. Cargol, McLean, VA (US)

( * ) Notice: Subject to any disclaimer, the term of this patent is extended or adjusted under 35 U.S.C. 154(b) by 0 days.

(21) Appl. No.: 12/704,616

(22) Filed: Feb. 12, 2010

Related U.S. Application Data (62) Division of application No. 11/940,557, filed on Nov. 15, 2007.

(51) Int. Cl.
*H03K 3/00* (2006.01)
(52) U.S. Cl. ....................... 307/106
(58) Field of Classification Search .................. 307/106; 333/20, 109, 206; 327/100, 172
See application file for complete search history.

(56) References Cited

U.S. PATENT DOCUMENTS

| | | | |
|---|---|---|---|
| 2,769,101 A | 10/1956 | Drosd | |
| 3,159,786 A | 12/1964 | Bayne | |
| 5,138,270 A | 8/1992 | Nakata et al. | |
| 5,519,327 A | 5/1996 | Consiglio | |
| 7,057,393 B2 | 6/2006 | Cargol et al. | |
| 7,541,889 B2 | 6/2009 | Maloney | |
| 7,560,948 B2* | 7/2009 | Grund | 324/762.01 |
| 2003/0006721 A1 | 1/2003 | Kinbara et al. | |
| 2007/0159205 A1 | 7/2007 | Grund | |
| 2007/0200436 A1 | 8/2007 | Barak | |

FOREIGN PATENT DOCUMENTS

| | | |
|---|---|---|
| JP | 2004350338 | 12/2004 |
| SU | 723769 | 3/1980 |

* cited by examiner

*Primary Examiner* — Jared J Fureman
*Assistant Examiner* — Daniel Cavallari
(74) *Attorney, Agent, or Firm* — Gauthier & Connors LLP

(57) ABSTRACT

A method of generating an electrical pulse to an output load is disclosed. The method includes the steps of establishing a first voltage on a first electrical conductor throughout an electrical length of the first electrical conductor, initiating the propagation of a voltage step at a first end of a second conductor having an electrical length that is substantially the same as the electrical length of the first electrical conductor, reversing a polarity of the voltage step and shifting the first voltage on the first electrical conductor when the voltage step reaches the second end of the second electrical conductor, and maintaining a shifted first voltage on the first electrical conductor when the voltage step on the second conductor returns to the first end of the second conductor.

20 Claims, 6 Drawing Sheets

METHODS FOR GENERATING HIGH VOLTAGE PULSES WITH A TRANSMISSION LINE

BACKGROUND

The invention generally relates to pulse generating systems, and relates in particular to pulse generating systems for providing high voltage and/or high current rectangular pulses with an electrical transmission line.

Many analytical fields such as materials analyses, semiconductor testing, and radar and X-ray investigations require the use of rectangular, high speed, high voltage, high current pulses. Generating such pulses generally requires bulky, heavy and/or complex and costly equipment. While several techniques for generating pulses with transmission line pulse systems are available, they are typically limited in that their output voltage is equal to the charge voltage unless specially engineered lines or complex interconnection systems are employed. For example, a conventional technique for generating a quality pulse is with a transmission line pulse generator that charges a line from a source voltage and then connects the transmission line to a load. In most instances the pulse duration of existing transmission line is equal to or less than the electrical length of the line, $t_L = l/c$ where l is the physical length of the line and c is the propagation velocity of the transmission line. Transmission line systems, such as a Blumlein Transmission Line for example, typically either halve the voltage or halve the usable electrical length of the cable.

Soviet Patent No. SU 723769 discloses a pulse modulator that includes a high voltage source power source, a charger mechanism, a transmission line and a load. This reference discloses that the duration of the pulse on the load is equal to the electrical length of the line and the output voltage equal to the charge voltage.

U.S. Pat. No. 2,769,101 discloses a transmission line based pulse generator that can multiply the pulse output voltage into a load of specific impedance with a plurality of transmission lines. This system requires transmission lines of electrical lengths totaling multiple durations of the output pulse to develop higher voltages.

U.S. Pat. No. 5,138,270 discloses a pulse generator using a Blumlein circuit, a transmission line having twice the impedance of Blumlein lines, and a matching resistor to generate a pulse of 2 or 4 times the charging voltage. This system requires lines of differing impedances as well as transmission lines of electrical lengths totaling multiple durations of the output pulse.

In many applications where size, weight, and cost are concerns, it is desirable to provide a simple transmission line pulse generator using only half the electrical length of cable as its output pulse duration and is capable of driving an arbitrary load at up to twice the charge voltage. In addition, a system that may operate without extensive control and accurate switching is highly desirable, particularly in extreme environments where high reliability is required.

There is a need, therefore, for a transmission line pulse generation system that provides increased output voltage and/or pulse duration, yet is efficient and economical to produce, and is robust in relatively hostile environments.

SUMMARY

In accordance with an embodiment, the invention provides a method of generating an electrical pulse to an output load. The method includes the steps of establishing a first voltage on a first electrical conductor throughout an electrical length of the first electrical conductor, initiating the propagation of a voltage step at a first end of a second conductor having an electrical length that is substantially the same as the electrical length of the first electrical conductor, reversing a polarity of the voltage step and shifting the first voltage on the first electrical conductor when the voltage step reaches the second end of the second electrical conductor, and maintaining a shifted first voltage on the first electrical conductor when the voltage step on the second conductor returns to the first end of the second conductor.

In accordance with another embodiment, the invention provides a method of generating an output pulse, wherein the method includes the steps of providing a voltage potential to a first conductor of a transmission line, coupling the first conductor of the transmission line to a second conductor of the transmission line at a first end of the transmission line, the second conductor of the transmission line being coupled to a fixed voltage potential at a second end of the transmission line, changing a voltage at the first end of the first conductor of the transmission line, coupling the first conductor of the transmission line to an output circuit, and providing the output pulse to a load via the output circuit.

In accordance with a further embodiment, the invention provides a method of generating an electrical pulse, wherein the method includes the steps of providing a first electrical conductor having a first electrical length, providing a second electrical conductor having first and second ends separated by a second electrical length that is substantially the same as the first electrical length, establishing a first voltage on the first electrical conductor throughout its first electrical length, initiating propagation of a voltage step having a polarity at a first end of said second conductor, reversing the polarity of the voltage step on the second electrical conductor to a reversed polarity, causing the first voltage on the first electrical conductor to be shifted when the voltage step reaches the second end of the second conductor, and providing a reflection at the first end of the second electrical conductor when the voltage step returns to the first end of the second conductor such that the when the pulse again reaches the second end it will cause a voltage shift.

BRIEF DESCRIPTION OF THE ILLUSTRATED EMBODIMENTS

The following description may be further understood with reference to the accompanying drawings in which.

The drawings are shown for illustrative purposes only.

DETAILED DESCRIPTION

The invention provides a system and method for delivering high voltage pulses of up to twice the charge voltage and a duration of twice the electrical length of the transmission-line with an output impedance equal to that of the transmission line in accordance with an embodiment of the invention. The output voltage $V_o$ is equal to $$V_o = -2\frac{Z_L}{Z_C + Z_L}V_C$$

where $V_C$ is the charge voltage, $Z_c$ is the characteristic line impedance, and $Z_L$ is the effective load impedance. The system in accordance with a further embodiment includes a length of transmission line with a commonly connected element and one end tied to ground, a switch or semiconductor switching device, a diode, and an output capacitor.

A further advantage of the present invention is that the output pulse is offset from the triggering or initiation of the pulse by one electrical length of the line. In instances where the pulse is used for sensitive or delicate measurements, a constant offset from any triggering noise generated to initiate the pulse may be desirable.

Figure 1:
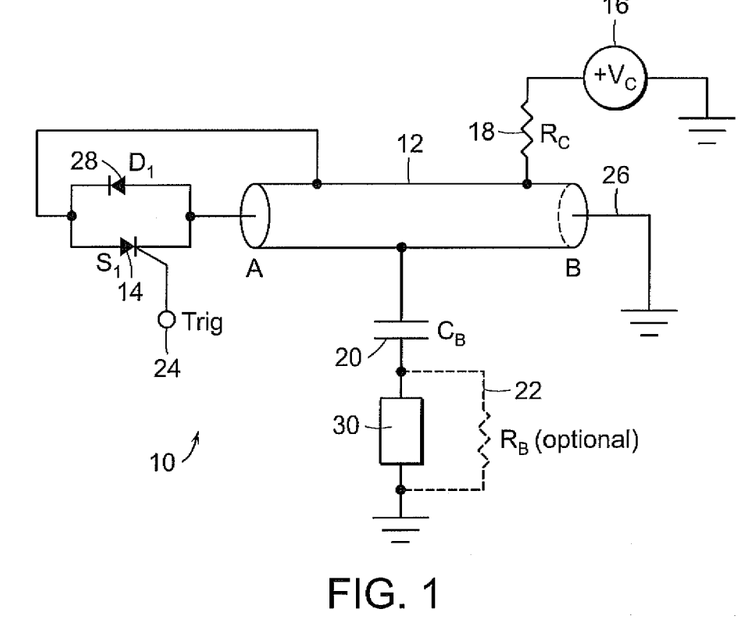
FIG. 1 shows a diagrammatic illustrative view of a pulse line generation system in accordance with an embodiment of the invention.

As shown in FIG. 1, a system 10 in accordance with an embodiment of the invention includes a coaxial transmission line having an outer conductor 12 that is coupled to a semiconductor switch 14 ($S_1$) having a trigger node 24, a voltage source 16 ($V_C$) via a resistor 18, and ground via a capacitor 20 ($C_B$) and the load 30. An inner conductor 26 of the transmission line 12 is coupled at one end (B) to ground as shown, and is coupled at the other end (A) to the switch 14 ($S_1$), which is coupled in parallel with a reverse diode 28 ($D_1$) to the first end (A) of the outer conductor 12. A resistor 22 ($R_B$) may optionally be coupled parallel to the load 30 between the capacitor 20 ($C_B$) and ground, to bias a capacitive load.

In the circuit of FIG. 1, current from the voltage source 16 ($V_C$) flows through the resistor 18 ($R_C$), charging the outer conductor 12 to voltage Vc relative to the inner conductor 26 which is at ground. The operation of the circuit begins when the semiconductor switch 14 ($S_1$), responsive to a trigger signal at the trigger node 24, connects the outer conductor 12 to the inner conductor 26. When the semiconductor switch 14 ($S_1$) closes, a voltage step ($V_S$) is provided wherein $$V_S = \frac{Z_L}{Z_C + Z_L}V_C$$

where $V_C$ is the charge voltage, $Z_c$ is the line impedance, and $Z_L$ is the effective load impedance. The voltage step propagates through the inner conductor 26 creating a pulse waveform on the outer conductor 12 that is coupled via the capacitor 20 ($C_B$) to the load 30. The reverse coupled diode 28 ($D_1$) captures any pulse reflections induced by the load impedance and prevents current from flowing from the source to the inner conductor 26 when the semiconductor switch 14 ($S_1$) is open. In other embodiments, a stripline over a common plane (which functions as the common element) may be used rather than a coaxial cable.

Figure 2:
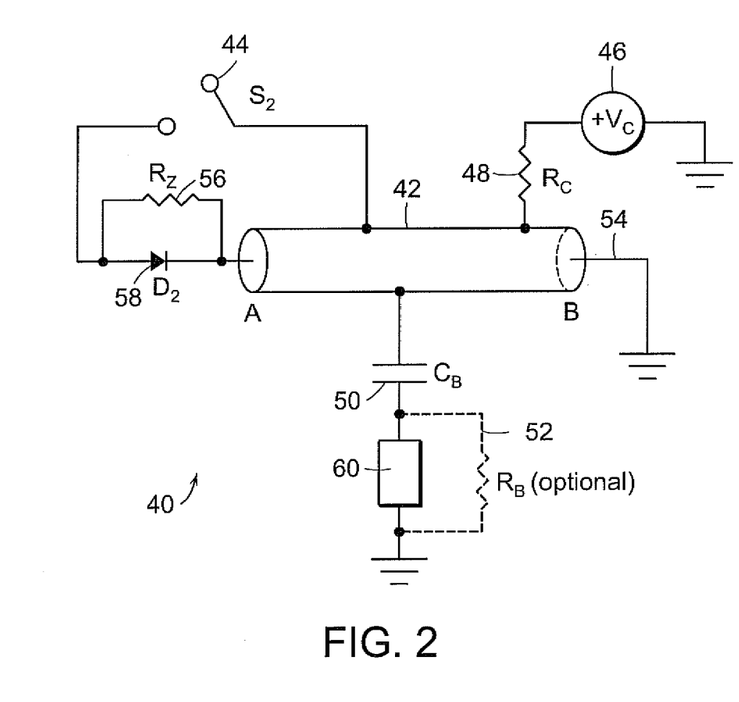
FIG. 2 shows a diagrammatic illustrative view of a pulse line generation system in accordance with another embodiment of the invention.

In accordance with another embodiment of the invention as shown in FIG. 2, a system 40 includes a coaxial transmission line having an outer conductor 42 that is coupled to a switch 44 ($S_2$), a voltage source 46 ($V_C$) via a resistor 48 ($R_C$), and ground via a capacitor 50 ($C_B$) and the load 60. An inner conductor 54 of the transmission line is coupled at one end (B) to ground as shown, and is coupled at the other end (A) to the switch 44 via a resistor 56 ($R_Z$) and diode 58 ($D_2$) that are connected in parallel between the switch 44 and the first end (A) of the outer conductor 42. A resistor 52 ($R_B$) may optionally be coupled parallel to the load 60 between the capacitor 50 ($C_B$) and ground, to bias a capacitive load When the switch 44 ($S_2$) is open, current from the voltage source 46 ($V_C$) flows through the resistor 48 ($R_C$) charging the outer conductor 42 to voltge Vc relative to the inner conductor 54, which is at ground potential. During operation, the switch 44 ($S_2$) closes and current flows from outer conductor 42 to inner conductor 54 through diode 58 ($D_2$), creating the same voltage step Vs discussed above on the inner conductor 54 the propagation of which creates a pulse waveform on the outer conductor 42 that is coupled via the capacitor 50 ($C_B$) to the load 60. The diode 58 ($D_2$) blocks reflections induced by the load, forcing them through terminating resistor 56 (Rz) having a resistance equal to the characteristic impedance of the line.

The embodiments show in FIGS. 1 and 2 differ in the triggering and dampening technique, but both operate in a similar fashion. In each embodiment, a transmission line of electrical length L is assembled such that one element of the line (e.g., the coaxial shield) is employed in the circuit as discussed above, and one end (B) of the other element (e.g., the inner conductor) is connected to ground. In the case of a coaxial transmission line, greater space and weight savings may be achieved by using an un-jacketed cable since the shield element is commonly connected. Alternatively, a strip line above a common plane can yield a very compact embodiment.

A significant aspect of this system is that the output terminal of the transmission line pulser comes from the commonly connected element of the line. In operation, this common element is charged up to a voltage $V_C$ via a charging resistor $R_C$. The pulse sequence is then initiated by shorting one end of the transmission line (A) to the commonly connected element. The device may be operated to produce an output pulse of either polarity by simply switching the charging polarity and the diode elements. In the following descriptions it will be assumed that the device is charged to a positive voltage $V_C$ and produces the negative pulse of amplitude $V_o$ as discussed above:

$$V_o = -2\frac{Z_L}{Z_C + Z_L}V_C.$$

Further, for illustrative purposes, FIGS. 3-8 assume a high impedance load giving a voltage $V_S$ that approximates $V_C$.

In either embodiment, the switching device shorts the common element of the transmission line to end A. Due to the realities of high speed switching and the costs and limitations of semi-conductor and relay devices, alternate methods of switching and terminating the pulse may be achieved. In the embodiment of FIG. 1 a high-speed semiconductor switch, such as a silicon controlled rectifier (SCR), thyristor, or a very high speed relay device is used to initiate the pulse ($S_1$). This device has the requirement that it must be able to switch off in $2t_L$ where $t_L$ is the electrical length of the line. The switching device does not have to interrupt current, and depending on the overall length of the pulse and desired cost of the device, it may be made of SCRs or other high speed semiconductor devices.

Figure 3:
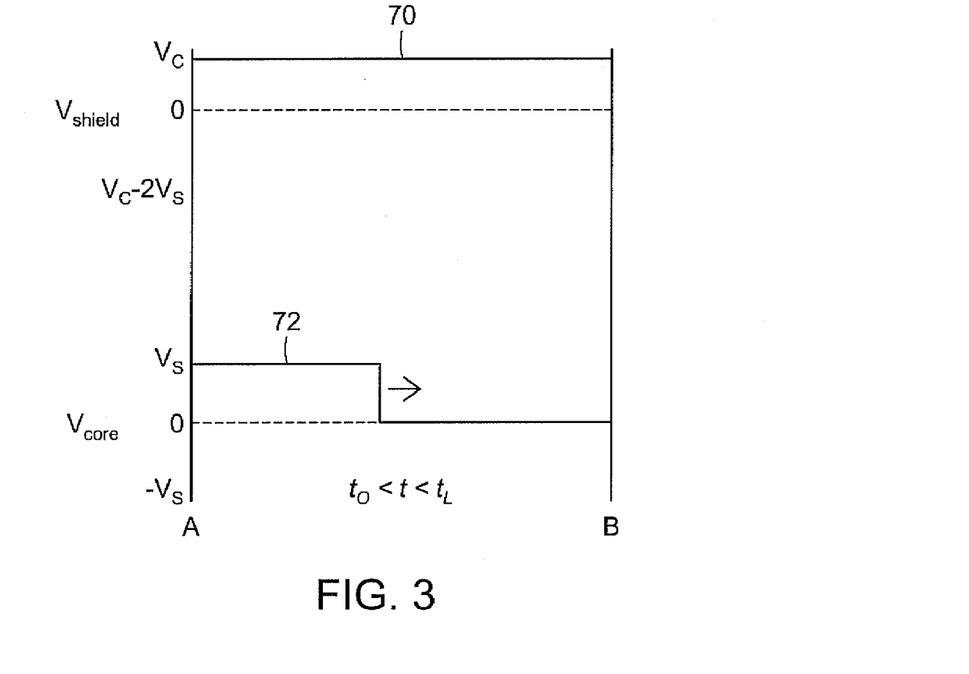
FIG. 3 shows a diagrammatic graphical representation of the voltages of the shield and the core from time $t_0$ to $t_L$.

In the embodiment of FIG. 2, switching is accomplished with a fast-make switch $S_2$ via diode $D_2$. The switch $S_2$ does not have a requirement of turning off within a specific timeframe. This shorting action creates a positive step of amplitude $V_S$ on the line that propagates from end A to end B. For example, FIG. 3 shows that while the voltage of the shield ($V_{SHIELD}$) is maintained at $V_C$ (as shown at 70) a voltage pulse travels along the core ($V_{CORE}$) as shown at 72 for time $t_0 < t < t_L$ where $t_L$ is the time for the pulse to travel the electrical length of the transmission line (A to B).

Figure 4:
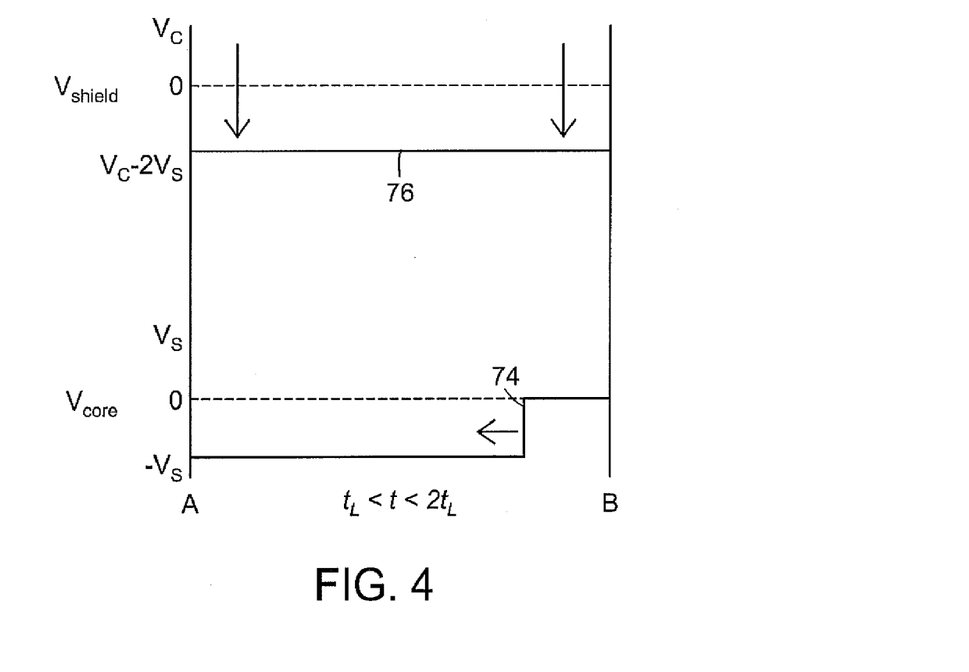
FIG. 4 shows a diagrammatic graphical representation of the voltages of the shield and the core from time $t_L$ to $2t_L$.
Figure 5A:
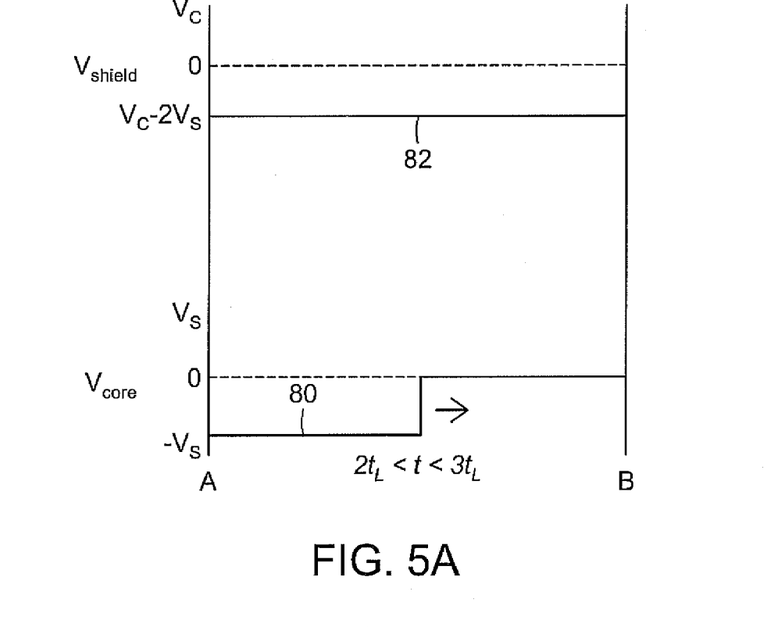
FIG. 5A shows a diagrammatic graphical representation of the voltages of the shield and the core from time $2t_L$ to $3t_L$ for a system as shown in FIG. 1.
Figure 5B:
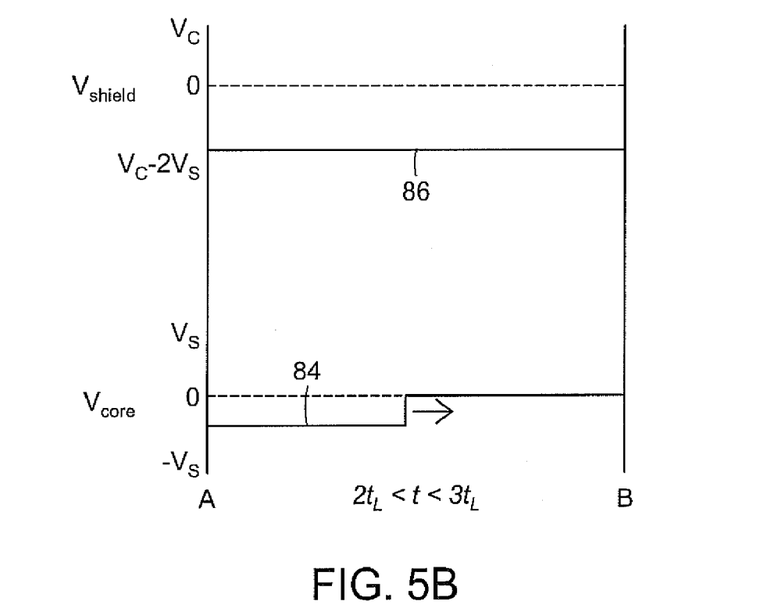
FIG. 5B shows a diagrammatic graphical representation of the voltages of the shield and the core from time $2t_L$ to $3t_L$ for a system as shown in FIG. 2.
Figure 6A:
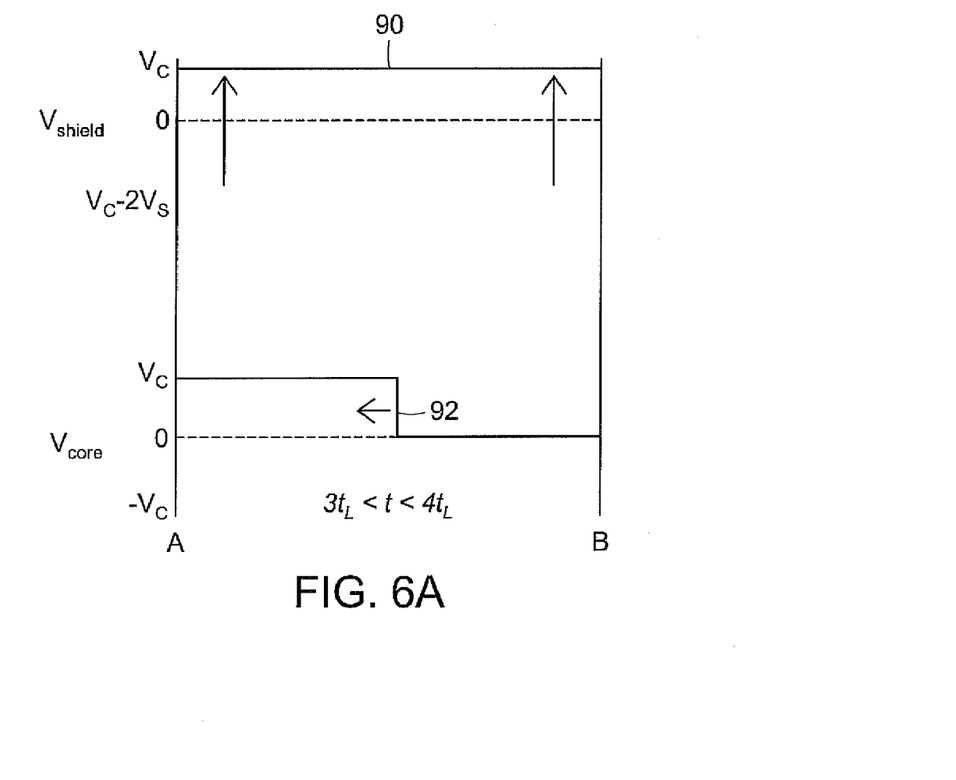
FIG. 6A shows a diagrammatic graphical representation of the voltages of the shield and the core from time $3t_L$ to $4t_L$ for a system as shown in FIG. 1.
Figure 6B:
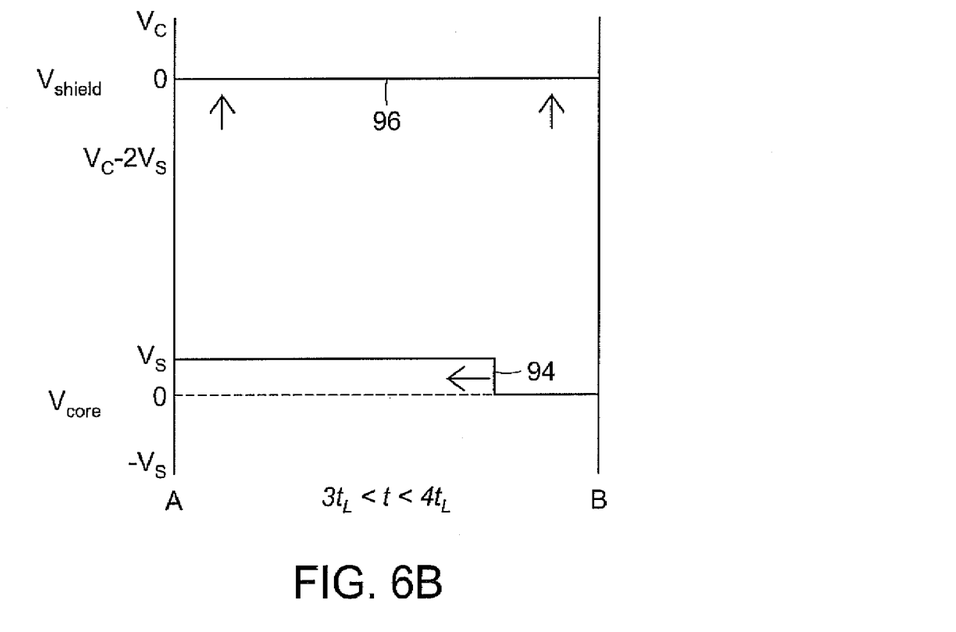
FIG. 6B shows a diagrammatic graphical representation of the voltages of the shield and the core from time $3t_L$ to $4t_L$ for a system as shown in FIG. 2.
Figure 7A:
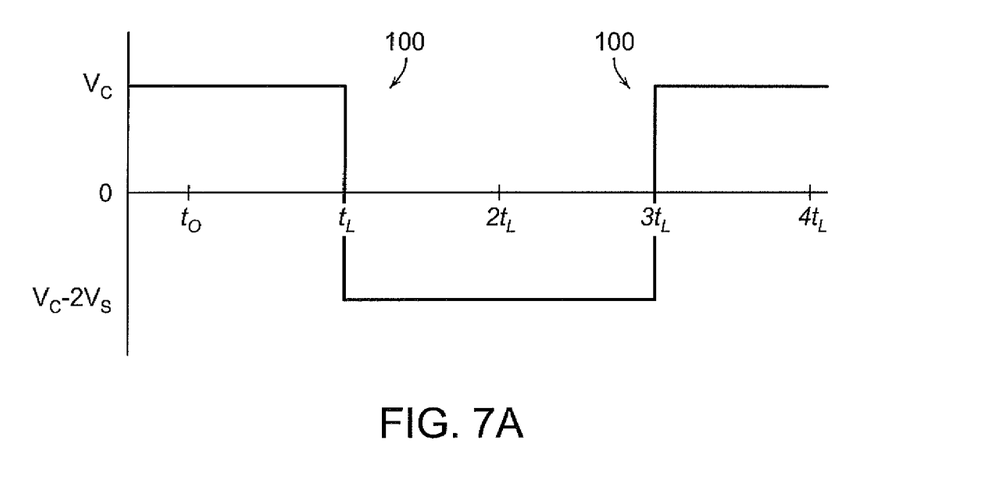
FIG. 7A shows a diagrammatic graphical representation of the voltage of a pulse in a system as shown in FIG. 1.
Figure 7B:
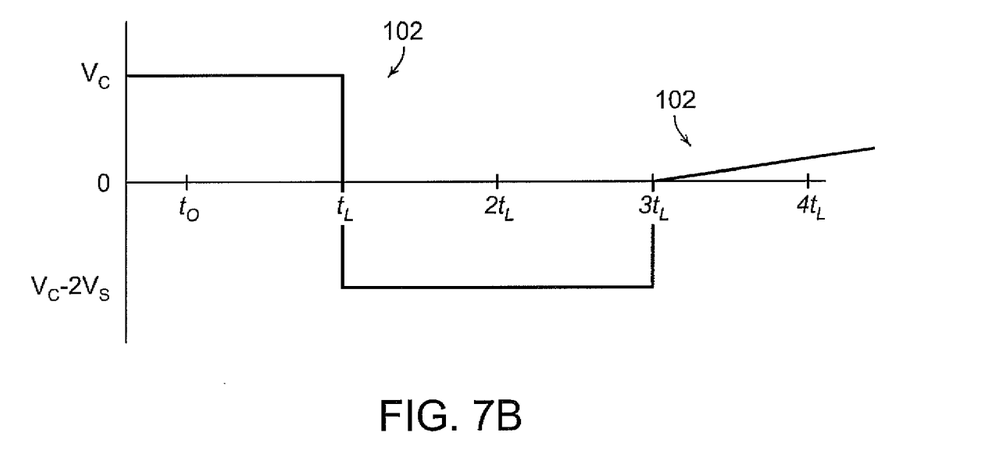
FIG. 7B shows a diagrammatic graphical representation of the voltage of a pulse in a system as shown in FIG. 2.

After time $t_L$ the voltage step reaches end B which is unterminated, giving a reflection coefficient of 1. Normally, the step wave would be reflected back on itself. If this were the case, the voltage of the core $V_{CORE}$ would have a wave reflecting back at $2V_S$ or a step of amplitude $V_S$–$V_C$ over the shield, which would remain at $V_C$. Since the end B is tied to ground however, it not possible for end B to deviate from ground potential, yet the reflected wave must have a positive going step of $2V_S$. In order to satisfy these conditions, at the reflection of the wave $V_{SHIELD}$ and $V_{CORE}$ are both instantaneously forced down by $2V_S$ so that end B remains at ground potential. FIG. 4 shows that while the voltage pulse travels back along the core at $-V_S$ as shown at 74 for time $t_L < t < 2t_L$ the voltage of the shield ($V_{SHIELD}$) is driven down by $-2V_S$ as shown at 76. When the positive going step from $-V_S$ to 0 propagates all the way back to end A at time $2t_L$ it may be terminated or reflected as discussed below.

In the embodiment of FIG. 1, the returning wave will encounter the conducting diode ($D_1$) creating a short and giving a reflection coefficient of $-1$. Thus, the reflected wave is a negative going step from 0 to $-V_S$ propagating again toward end B as shown at 80 in FIG. 5A. The voltage of the shield $V_{SHIELD}$ is then $V_C-2V_S$ as shown at 82. During this time, the current into the line passes through $D_1$ as shown at 116 in FIG. 9, and the switch element $S_1$ can transition to the off position.

In the embodiment shown in FIG. 2, the wave is terminated by the resistor $R_Z$ having a resistance equal to the impedance of the line. Upon termination of the wave, however, there still exists a potential difference between the shield ($V_{SHIELD}$) and the core ($V_{CORE}$). Thus, a new step wave begins as shown at 84 in FIG. 5B, only this time, the diode $D_2$ is reverse biased and the current flows from the shield to the core via $R_Z$. The amplitude of this new wave is now halved as the line is charging in series with $R_Z$, doubling the charging impedance. This $-V_S/2$ step wave propagates toward end B as shown at 84 in FIG. 5B, and the voltage of the shield ($V_{SHIELD}$) is at $V_C-2V_S$ as shown at 86 in FIG. 5B.

When the returning wave encounters end B, it is reflected in a fashion similar to that shown in FIG. 4, only this time the polarity is reversed to positive. In the embodiment of FIG. 1, this reflection forces the shield up by $2V_S$, returning it to $V_C$ as shown at 90 in FIG. 6A, and sends a negative going step to 0 volts propagating back to end A as shown at 92. In the alternate embodiment, the shield potential is only forced up to 0 volts ($2\times(V_S/2)$ moves it up only $+V_S$ volts) and a negative going step of 0 volts propagates toward end A as shown at 94 in FIG. 6B, while the voltage of the shield is at zero volts as shown at 96.

When the negative step wave reaches end A in the embodiment of FIG. 1, it flows to the shield through $D_1$. Normally the short circuit produced by $D_1$ would produce a pulse of $-1$ times the negative going pulse, a positive reflection. However, as the diode $D_1$ blocks positive current, and the switch $S_1$ has shut off, the cable core cannot be charged and at time $4t_l$ the operation of the system has ended producing the waveform on the shield that is show at 100 in FIG. 7A.

In the embodiment of FIG. 2, when the negative going $V_S/2$ step reaches the resistor $R_Z$ it is terminated by the characteristic impedance of the transmission line and leaves a voltage differential of 0 between the shield and the core. At this time $4t_l$, the pulse event has ended and produces the shield waveform shown at 102 in FIG. 7B.

Figure 8:
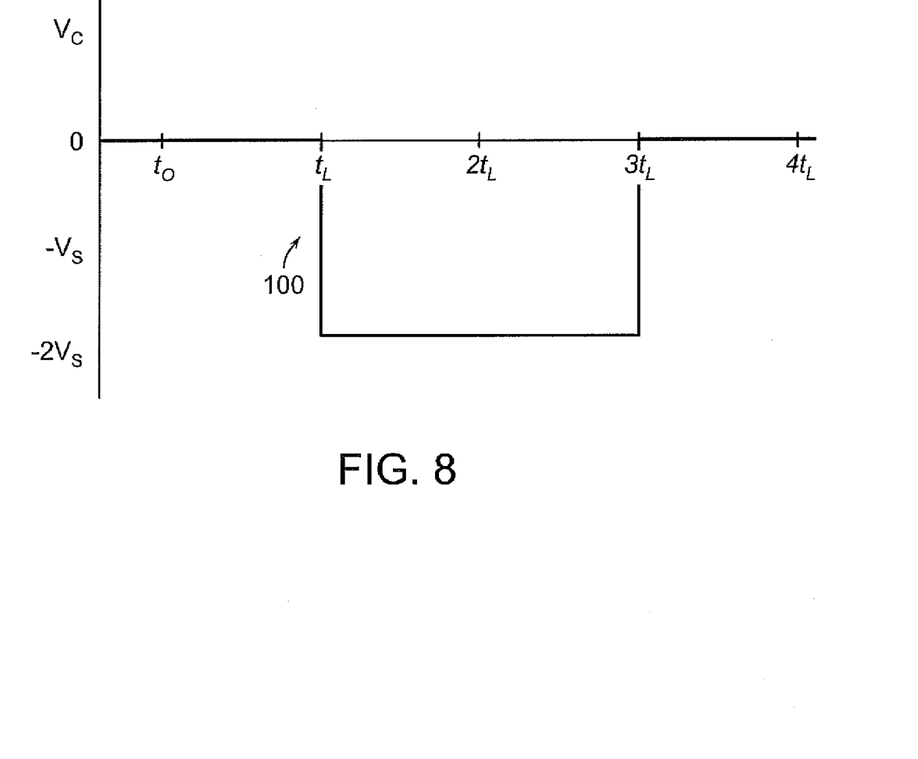
FIG. 8 shows a diagrammatic graphical representation of a decoupled voltage pulse in a system as shown in FIG. 1.
Figure 9:
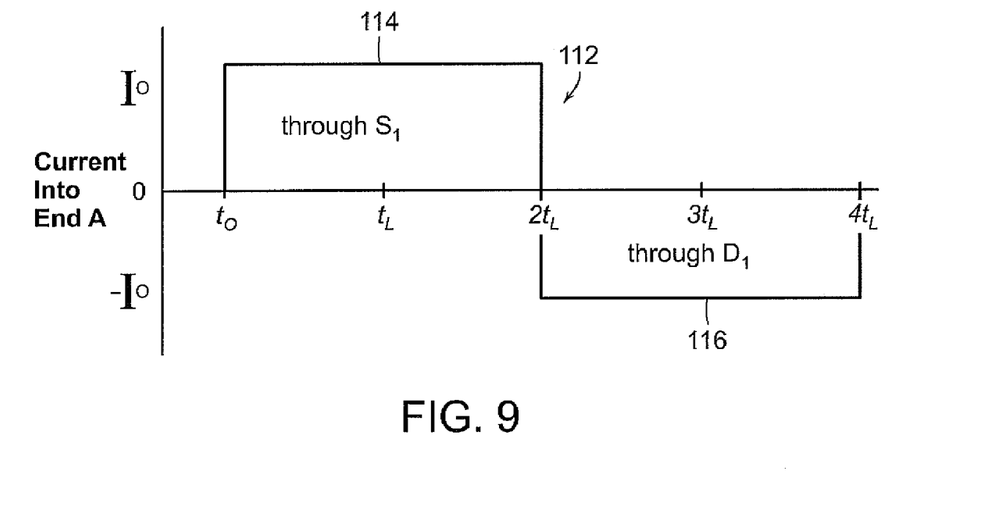
FIG. 9 shows a diagrammatic graphical representation of the current associated with a voltage pulse in a system of the invention.

Finally, in either embodiment, the output pulse may be decoupled from the $+V_C$ biased shield with capacitor $C_B$, giving a mono-polar negative going voltage pulse of $-2V_S$ as shown at 110 in FIG. 8. The current into end A of the transmission line is shown at 112 in FIG. 9, and includes a first portion 114 where positive current passes through the switching diode $S_1$, followed by a second portion 116 where negative current passes through the diode $D_1$. The value of the capacitor $C_B$ will depend on the load being driven and the duration of the pulse and must be of sufficient size to convey the pulse signal with minimal distortion. $C_B$ can be varied to meet the desired quality of output pulse, but in general, $C_B$ will be on the order of:

$$C_B = 10 t_L \frac{Z_L}{(Z_L + Z_C)^2}$$

where $C_B$ is in Farads, $t_L$ is the electrical length of the line in seconds, $Z_C$ is the line impedance, and $Z_L$ is the effective load impedance in ohms. The resistor $R_B$ is chosen to be sufficient to adequately bias a capacitive load, but not unnecessarily load the system as $R_B$ factors into the effective load impedance $Z_L$, effecting $V_S$ and $C_B$.

In accordance with various embodiments, therefore, the invention provides a transmission line pulse generator that uses a commonly connected shield, plane, or line element as the output terminal. In further embodiments, the system provides that one end of the other element is directly grounded, and that the line uses reflections off of a grounded element to shift the voltage of the whole system. In accordance with further embodiments, the invention provides a transmission line pulse generator that uses a capacitor to decouple a bi-polar signal from above terminal. In accordance with still further embodiments, the invention provides a transmission line pulse generator that is switched by switching the common terminal to the core or other line element, and a transmission line pulse generator that uses a diode with the switch element above to bloc oscillations, and further uses terminating resistor in parallel with diode.

Those skilled in the art will appreciate that numerous modifications and variations may be made to the above disclosed embodiments without departing from the spirit and scope of the invention.

What is claimed is:

1. A method of generating an electrical pulse to an output load, said method comprising the steps of:
    establishing a first voltage on a first electrical conductor throughout an electrical length of the first electrical conductor;
    initiating the propagation of a voltage step at a first end of a second conductor having an electrical length that is substantially the same as the electrical length of the first electrical conductor;
    reversing a polarity of the voltage step and shifting the first voltage on the first electrical conductor when the voltage step reaches the second end of the second electrical conductor; and
    maintaining a shifted first voltage on the first electrical conductor when the voltage step on the second conductor returns to the first end of the second conductor.

2. The method as claimed in claim 1, wherein the shifted first voltage on the first electrical conductor is maintained until the voltage step on the second conductor again returns to the second end of the second conductor.

3. The method as claimed in claim 2, wherein the first voltage on the first electrical conductor returns to the first voltage when the voltage step on the second conductor again returns to the second end of the second conductor.

4. The method as claimed in claim 1, wherein the second conductor is connected to ground at the second end of the second conductor.

5. The method as claimed in claim 1, wherein the step of maintaining the shifted voltage on the first electrical conductor when the voltage step on the second conductor returns to the first end of the second conductor, includes producing a reflection such that when the voltage step again reaches the second end, it will cause a voltage shift.

6. The method as claimed in claim 5, wherein the step of maintaining the shifted voltage on the first electrical conductor when the voltage step on the second conductor returns to the first end of the second conductor, includes blocking reflections when the voltage step again reaches the first end that are induced by the output load using a resistor that has a resistance that matches the line impedance.

7. The method as claimed in claim 1, wherein the electrical pulse that is applied to the output load has a pulse width that is twice the time required for the voltage step to travel from the first end of the second conductor to the second end of the second conductor.

8. A method of generating an output pulse, said method comprising the steps of:
    providing a voltage potential to a first conductor of a transmission line;
    coupling the first conductor of the transmission line to a second conductor of the transmission line at a first end of the transmission line, the second conductor of the transmission line being coupled to a fixed voltage potential at a second end of the transmission line;
    changing a voltage at the first end of the first conductor of the transmission line;
    coupling the first conductor of the transmission line to an output circuit; and
    providing the output pulse to a load via the output circuit.

9. The method as claimed in claim 8, wherein said step of changing a voltage at the first end of the first conductor of the transmission line involves activating a semiconductor switch that is in connected in parallel with a reverse biased diode.

10. The method as claimed in claim 8, wherein said step of changing a voltage at the first end of the first conductor of the transmission line involves activating a mechanical switch that is coupled to the second conductor via a forward biased diode.

11. The method as claimed in claim 8, wherein said transmission line is a coaxial cable and the first conductor is the shield of the coaxial cable and the second conductor is the core of the coaxial cable.

12. The method as claimed in claim 8, wherein said second conductor of the transmission line is coupled to ground at a second end of the transmission line.

13. The method as claimed in claim 8, wherein said step of providing the output pulse to a load via the output circuit involves providing the output pulse to a capacitor that is connected in series with a resistor, wherein the output pulse is provided at a node between the capacitor and the resistor.

14. The method as claimed in claim 8, wherein said step of providing the output pulse to a load via the output circuit involves providing the output pulse as a voltage potential having an absolute value of greater than the voltage potential of a voltage source that is used to provide the voltage potential to the first conductor of the transmission line.

15. The method as claimed in claim 8, wherein said step of providing the output pulse to a load via the output circuit involves providing the output pulse as a rectangular pulse having a pulse width of twice the time required for a voltage potential to travel from the first end of the transmission line to the second end of the transmission line.

16. A method of generating an electrical pulse, said method comprising the steps of:
    providing a first electrical conductor having a first electrical length;
    providing a second electrical conductor having first and second ends separated by a second electrical length that is substantially the same as the first electrical length;
    establishing a first voltage on the first electrical conductor throughout its first electrical length;
    initiating propagation of a voltage step having a polarity at a first end of said second conductor;
    reversing the polarity of the voltage step on the second electrical conductor to a reversed polarity, causing the first voltage on the first electrical conductor to be shifted when the voltage step reaches the second end of the second conductor; and
    providing a reflection at the first end of the second electrical conductor when the voltage step returns to the first end of the second conductor such that the when the pulse again reaches the second end it will cause a voltage shift.

17. The method as claimed in claim 16, wherein said step of initiating propagation of a voltage step having a polarity at a first end of said second conductor involves activating a semiconductor switch.

18. The method as claimed in claim 16, wherein said step of reversing the polarity of the voltage step on the second electrical conductor to a reversed polarity involves coupling the second electrical conductor to ground.

19. The method as claimed in claim 16, wherein said step of providing a reflection at the first end of the second electrical conductor when the voltage step returns to the first end of the second conductor involves coupling the first end of the second electrical conductor to a reverse coupled diode.

20. The method as claimed in claim 16, wherein said step of providing a reflection at the first end of the second electrical conductor when the voltage step returns to the first end of the second conductor involves coupling the first end of the second electrical conductor to a resistor that has a resistance that matches an impedance of a transmission line that includes the first electrical conductor and the second electrical conductor.

* * * * *